United States Patent
Song et al.

(10) Patent No.: US 8,859,371 B2
(45) Date of Patent: Oct. 14, 2014

(54) METHOD FOR MANUFACTURING SEMICONDUCTOR DEVICE HAVING DUAL GATE DIELECTRIC LAYER

(71) Applicant: Samsung Electronics Co., Ltd., Suwon-si (KR)

(72) Inventors: Myung Geun Song, Yongin-si (KR); Ki-Hyung Ko, Suwon-si (KR); Hayoung Jeon, Hwaseong-si (KR); Boun Yoon, Seoul (KR); Jeongnam Han, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/795,839

(22) Filed: Mar. 12, 2013

(65) Prior Publication Data

US 2013/0244414 A1    Sep. 19, 2013

(30) Foreign Application Priority Data

Mar. 15, 2012  (KR) .......................... 10-2012-0026721

(51) Int. Cl.
    *H01L 21/8234*    (2006.01)
(52) U.S. Cl.
    USPC .......... 438/275; 438/216; 438/287; 438/591; 257/E21.675
(58) Field of Classification Search
    USPC ................ 438/197, 199, 216, 275, 287, 591; 257/E21.675
    See application file for complete search history.

(56) References Cited

U.S. PATENT DOCUMENTS

| | | | |
|---|---|---|---|
| 6,787,421 B2 | 9/2004 | Gilmer et al. | |
| 6,818,514 B2 | 11/2004 | Kim et al. | |
| 6,891,233 B2 | 5/2005 | Lin et al. | |
| 6,958,278 B2 | 10/2005 | Lee | |
| 7,026,203 B2 | 4/2006 | Lee | |
| 7,846,790 B2 | 12/2010 | Kang et al. | |
| 2005/0205940 A1 | 9/2005 | Ootsuka | |
| 2008/0079084 A1* | 4/2008 | Hanafi | 257/369 |
| 2008/0099856 A1 | 5/2008 | Kang et al. | |
| 2011/0254093 A1 | 10/2011 | Wang et al. | |

FOREIGN PATENT DOCUMENTS

| | | |
|---|---|---|
| KR | 10-0399911 | 9/2003 |
| KR | 10-2004-0041876 | 5/2004 |
| KR | 10-2005-0000054 | 1/2005 |
| KR | 10-0801706 | 1/2008 |

* cited by examiner

*Primary Examiner* — Thanhha Pham
(74) *Attorney, Agent, or Firm* — Onello & Mello, LLP (57) ABSTRACT

Methods for manufacturing a semiconductor device having a dual gate dielectric layer may include providing a substrate including first and second regions, forming a first gate dielectric layer having a first thickness on the substrate, forming an interlayer insulating layer including first and second trenches exposing the first gate dielectric layer in the first and second regions, forming a sacrificial layer on the interlayer insulating layer and bottoms of the first and second trenches, forming a sacrificial pattern exposing the first gate dielectric layer of the bottom of the first trench, removing the first gate dielectric layer of the bottom of the first trench, forming a second gate dielectric layer having a second thickness on the bottom of the first trench, removing the sacrificial pattern, and forming a gate electrode on each of the first and second gate dielectric layers.

23 Claims, 7 Drawing Sheets

METHOD FOR MANUFACTURING SEMICONDUCTOR DEVICE HAVING DUAL GATE DIELECTRIC LAYER

CROSS-REFERENCE TO RELATED APPLICATIONS

This U.S. non-provisional patent application claims priority under 35 U.S.C. §119 to Korean Patent Application No. 10-2012-0026721, filed on Mar. 15, 2012, the entirety of which is incorporated by reference herein.

FIELD

The inventive concept relates to methods for manufacturing a semiconductor device having a dual gate dielectric layer including gate dielectric layers having thicknesses that are different from each other.

BACKGROUND

A semiconductor device may include gate dielectric layers respectively having thicknesses different from each other by a replacement metal gate (RMG) process called a "gate last process." A high-voltage region may need a relatively thick gate dielectric layer and a low-voltage region may need a relatively thin gate dielectric layer. The semiconductor device including the gate dielectric layers having different thicknesses may be manufactured in the high-voltage region and the low-voltage region by the gate last process.

SUMMARY

In accordance with various aspects of the inventive concept, there are provided methods for manufacturing a semiconductor device having improved reliability of transistors thereof.

In one aspect, a method for manufacturing a semiconductor device may include: providing a substrate including a first region and a second region; forming a first gate dielectric layer having a first thickness on the substrate; forming an interlayer insulating layer on the substrate, the interlayer insulating layer including a first trench exposing the first gate dielectric layer of the first region and a second trench exposing the first gate dielectric layer of the second region; forming a sacrificial layer on the interlayer insulating layer and bottoms of the first and second trenches; forming a mask pattern covering the second trench of the second region on the sacrificial layer; removing the sacrificial layer in the first region using the mask pattern as an etch mask to form a sacrificial pattern exposing the first gate dielectric layer of the bottom of the first trench; removing the first gate dielectric layer of the bottom of the first trench to expose the substrate; removing the mask pattern; removing the sacrificial pattern; forming a second gate dielectric layer having a second thickness on the bottom of the first trench; and forming a gate electrode on each of the first gate dielectric layer and the second gate dielectric layer.

Forming the interlayer insulating layer, including the first trench and the second trench, may comprise forming a first dummy gate pattern on the first gate dielectric layer of the first region, forming a second dummy gate pattern on the first gate dielectric layer of the second region, forming an the interlayer insulating layer exposing top surfaces of the first dummy gate pattern and the second dummy gate pattern, and removing the first dummy gate pattern and the second dummy gate pattern.

The method further comprises forming a spacer on a sidewalls of each of the first and second dummy gate patterns.

The method may further comprise forming a high-k dielectric material between each of the gate electrodes and each of the first and second gate dielectric layers.

The sacrificial layer may include at least one of a silicon oxide layer, a silicon nitride layer, a poly-crystalline silicon layer, and a metal layer.

The sacrificial layer may be formed by an atomic layer deposition (ALD) method.

Removing the sacrificial layer in the first region using the mask pattern as the etch mask may be performed using a solution including at least one of hydrogen fluoride, phosphoric acid, sulfuric acid, hydrogen peroxide, ammonium hydroxide, hydrogen chloride, and amine.

Removing the first gate dielectric layer of the bottom of the first trench to expose the substrate may be performed by a chemical oxide removal (COR) method using a HF gas and a NH3 gas, or a chemical etching by plasma (CEP) method using NH3 and NF3 remote plasma.

The mask pattern may be formed of a photoresist.

Removing the mask pattern may be performed using an organic stripper, sulfuric acid, or a mixture solution of sulfuric acid and hydrogen peroxide.

The method may include forming a chemical oxide layer on the substrate exposed by the first trench when the mask pattern is removed and removing the chemical oxide layer simultaneously with the sacrificial pattern when the sacrificial pattern is removed.

The method may include forming the first gate dielectric layer by a dry oxidation method or a radical oxidation method.

The method may include forming the second gate dielectric layer by a chemical oxidation method.

The first thickness of the first gate dielectric layer may be greater than the second thickness of the second gate dielectric layer.

The gate electrode may include at least one of titanium, titanium nitride, tantalum, tantalum nitride, tungsten, copper, aluminum and any combination thereof.

Removing the sacrificial pattern may be performed simultaneously with the formation of the second gate dielectric layer having the second thickness on the bottom of the first trench.

The method may include forming the sacrificial layer of titanium nitride, wherein forming the second gate dielectric layer may be performed using a solution including ammonium hydroxide and hydrogen peroxide or a solution including ozone.

In another aspect, a method for manufacturing a semiconductor device may include: providing a substrate including a first region and a second region; forming a first gate dielectric layer having a first thickness on the substrate; forming an interlayer insulating layer on the substrate, the interlayer insulating layer including a first trench exposing the first gate dielectric layer of the first region and a second trench exposing the first gate dielectric layer of the second region; forming a sacrificial layer on the interlayer insulating layer and bottoms of the first and second trenches; forming a mask pattern covering the second trench of the second region on the sacrificial layer; removing the sacrificial layer in the first region using the mask pattern as an etch mask to form a sacrificial pattern covering the second trench; removing the mask pattern; removing the first gate dielectric layer of the bottom of the first trench using the sacrificial pattern as an etch mask to expose the substrate; forming a second gate dielectric layer having a second thickness on the bottom of the first trench;

and forming a gate electrode on each of the first gate dielectric layer and the second gate dielectric layer.

The method may further comprise forming a high-k dielectric material between each of the gate electrodes and each of the first and second gate dielectric layers.

In still another aspect, a method for manufacturing a semiconductor device may include: providing a substrate including a first region and a second region; forming a first gate dielectric layer having a first thickness on the substrate; forming an interlayer insulating layer on the substrate, the interlayer insulating layer including a first trench exposing the first gate dielectric layer of the first region and a second trench exposing the first gate dielectric layer of the second region; forming a sacrificial layer on the interlayer insulating layer and bottoms of the first and second trenches; forming a mask pattern covering the second trench of the second region on the sacrificial layer; removing the sacrificial layer in the first region using the mask pattern as an etch mask to form a sacrificial pattern; removing an upper portion of the first gate dielectric layer of the bottom of the first trench to form a second gate dielectric layer having a second thickness smaller than the first thickness; and forming a gate electrode on each of the first gate dielectric layer and the second gate dielectric layer.

According to another aspect of the invention, provided is a method for manufacturing a semiconductor device having a dual gate dielectric layer. The method includes: providing a substrate including first and second regions; forming a first gate dielectric layer having a first thickness on the substrate; forming an interlayer insulating layer including first and second trenches exposing the first gate dielectric layer in the first and second regions; forming a sacrificial layer on the interlayer insulating layer and bottoms of the first and second trenches; forming a sacrificial pattern exposing the first gate dielectric layer of the bottom of the first trench; forming a second gate dielectric layer having a second thickness on the bottom of the first trench; removing the sacrificial pattern; and forming a gate electrode on each of the first and second gate dielectric layers.

The second dielectric layer may be thinner than the first dielectric layer.

The method may further comprise forming a high-k dielectric material between each of the gate electrodes and each of the first and second gate dielectric layers.

BRIEF DESCRIPTION OF THE DRAWINGS

The inventive concept will become more apparent in view of the attached drawings and accompanying detailed description, wherein the drawings show exemplary embodiments of devices, features, and methods in accordance with aspects of the inventive concepts.

DETAILED DESCRIPTION OF THE EMBODIMENTS

The exemplary embodiments in accordance with the inventive concept will now be described hereinafter with reference to the accompanying drawings. Various advantages and features of the inventive concept and methods of achieving them will be apparent from the following exemplary embodiments. It should be noted, however, that the inventive concept is not limited to the following exemplary embodiments, and may be implemented in various forms. In the drawings, embodiments of the inventive concept are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiments presented in the detailed description will be described with respect sectional views provided in the drawings, which are provided as ideal exemplary views of semiconductor devices in accordance with the inventive concept. Accordingly, shapes presented in the exemplary views may be modified according to manufacturing techniques and/or allowable errors. Therefore, the inventive concept is not limited to the specific exemplary views provided in the figure or the shapes shown therein, but may include other shapes that may be the result of or dictated by various manufacturing processes. Areas exemplified in the drawings have general properties, and should not be construed as limiting the scope of the inventive concept.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concept explained and illustrated herein include their complementary counterparts. The same reference numerals or the same reference designators denote the same elements throughout the specification, unless otherwise indicated to apparent.

Methods for manufacturing a semiconductor device according to various embodiments of the inventive concept will be described with reference to FIGS. 1 to 16. FIGS. 1 through 8, 9A, 10A, and 11 through 16 are cross-sectional views illustrating a method for manufacturing a semiconductor device according to some embodiments of the inventive concept. For the purposes of ease and convenience, source/drain regions formed in a substrate and metal interconnection layers disposed over transistors are omitted in the drawings. However, those skilled in the art will readily understand and appreciate the presence of source/drain regions in a transistor.

Figure 1:
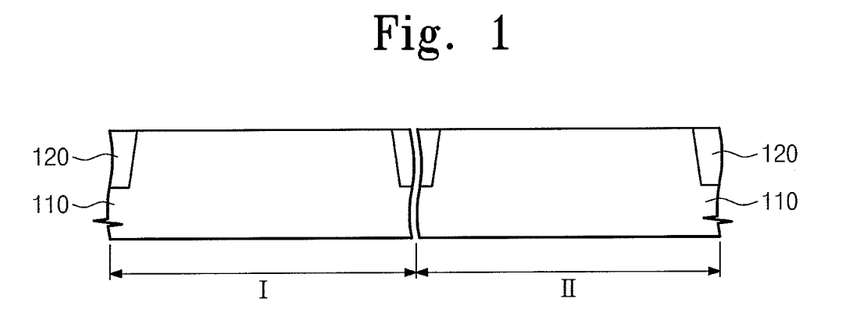
FIGS. 1 through 8 are cross-sectional views illustrating a first group of steps useful in various embodiments of a method for manufacturing a semiconductor device according to aspects of the inventive concept.

Referring to the embodiment of FIG. 1, a substrate 110 is provided. The substrate 110 may be a silicon substrate, for example, a bulk silicon substrate or a silicon-on-insulator (SOI) substrate. In other embodiments, the substrate 110 may include a material different from the silicon substrate. As examples, the substrate 110 may include germanium, indium antimonide, lead-tellurium compound, indium-arsenic, indium phosphide, gallium-arsenic, or gallium antimonide.

The substrate 110 may include a first region I and a second region II. The first region I and the second region II may have electrical characteristics different from each other, respectively. For example, the first region I may be a region in which a transistor operated by a low-voltage is formed, and the second region II may be a region in which a transistor operated by a high-voltage is formed. Therefore, the voltage of the second region II is higher than the voltage of the first region I.

Device isolation layers 120 may be formed at a boundary of the first and second regions I and II. In the present embodiment, a device isolation layer 120 is formed in each of the first region I and the second region II, respectively.

Figure 2:
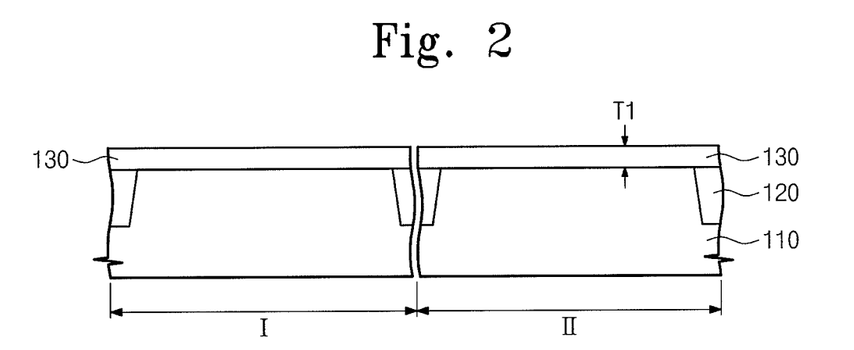

Referring to the embodiment of FIG. 2, a first gate dielectric layer 130 is formed on the substrate 110. The first gate dielectric layer 130 may be formed using a dry oxidation method or a radical oxidation method, as an example. The dry oxidation method or the radical oxidation method may use an oxygen ($O_2$) gas and a hydrogen ($H_2$) gas to form a silicon oxide layer having a thickness (T1) within a range of about 25 Å to about 38 Å. Particularly, the first gate dielectric layer 130 may be a silicon oxide layer having a thickness of about 33 Å. The radical oxidation method may reduce a formation time of the first gate dielectric layer 130 as compared with that of the dry oxidation method.

Figure 3:
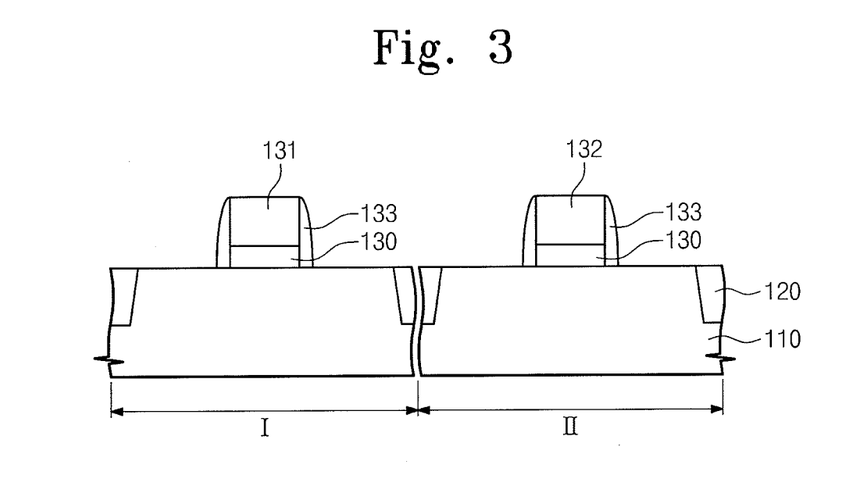

Referring to the embodiment of FIG. 3, first and second dummy gate patterns 131 and 132 are formed on the first gate dielectric layer 130. The first and second dummy gate patterns 131 and 132 may be formed in the first and second regions I and II, respectively. Portions of the first gate dielectric layer 130 beyond the first and second dummy gate patterns 131 and 132 may be removed or not be removed. FIG. 3 illustrates the embodiment wherein the first gate dielectric layer 130 beyond the first and second dummy gate patterns 131 and 132 has been removed. The first and second dummy gate patterns 131 and 132 may be formed of a semiconductor material, for example, poly-crystalline silicon.

A spacer 133 may be formed on sidewalls of each of the first and second dummy gate patterns 131 and 132. The spacer 133 may be formed of a silicon nitride layer and/or a silicon oxynitride layer, as examples. However, in some embodiments, the spacer 133 may not be formed, e.g., to streamline a manufacturing process.

Figure 4:
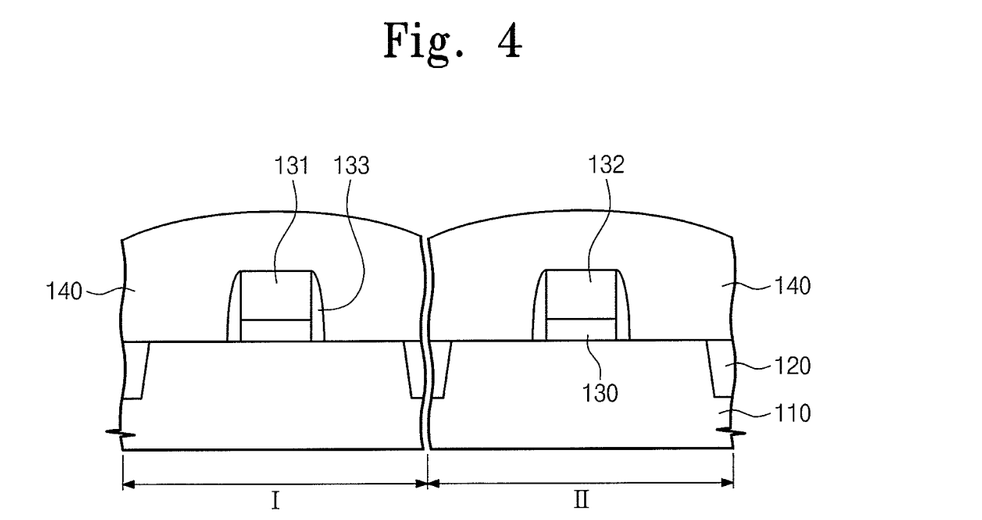
Figure 5:
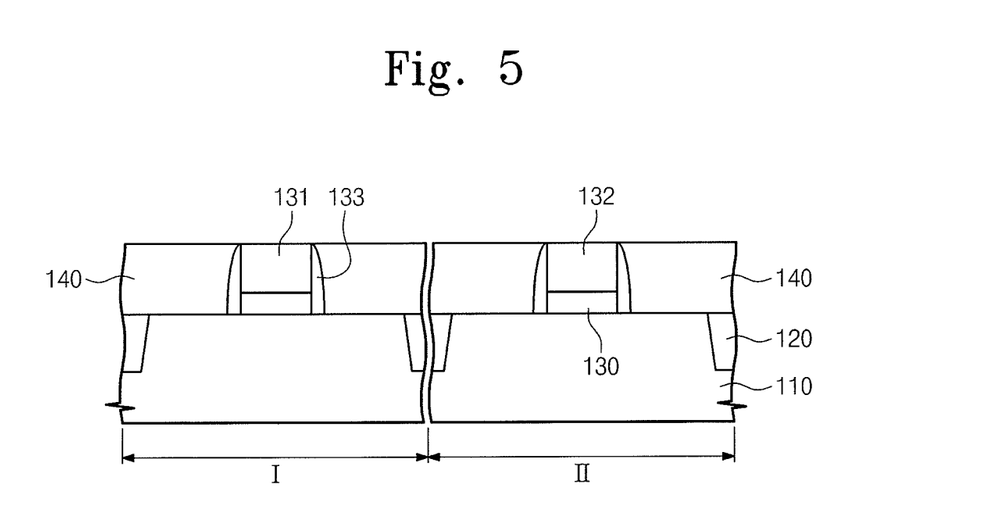

Referring to the embodiments of FIGS. 4 and 5, an interlayer insulating layer 140 may be formed to cover the dummy gate patterns 131 and 132 formed in the first and second regions I and II. The interlayer insulating layer 140 may be a silicon oxide layer formed by a high-density plasma (HDP) method or a flowable chemical vapor deposition (FCVD) method, as examples. The interlayer insulating layer 140 may be planarized to expose top surfaces of the first and second dummy gate patterns 131 and 132, as shown in FIG. 5. The planarization of the interlayer insulating layer 140 may be performed using an etch-back process or a chemical mechanical polishing (CMP) process, as examples.

Figure 6:
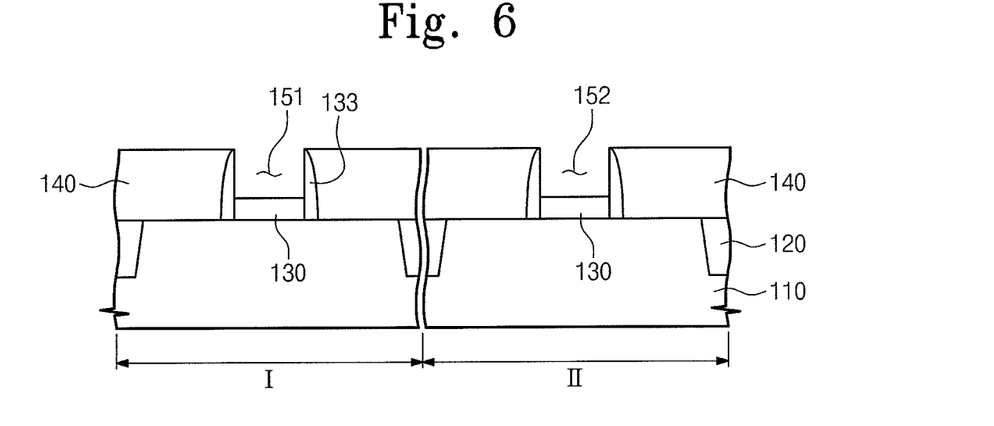

Referring to the embodiment of FIG. 6, the first and second dummy gate patterns 131 and 132 are removed to form a first trench 151 and a second trench 152 in the first region I and the second region II, respectively. Accordingly, the first gate dielectric layer 130 may be exposed in both regions.

Figure 7:
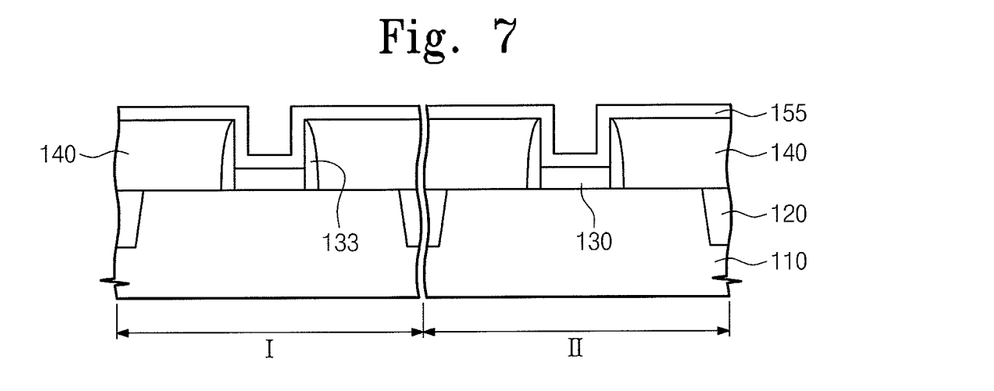

Referring to the embodiment of FIG. 7, a sacrificial layer 155 is conformally formed to cover a top surface interlayer insulating layer 140, sidewalls and a bottom of the first trench 151, and sidewalls and a bottom of the second trench 152. Thus, the sacrificial layer 155 may be formed on the first gate dielectric layer 130 at the bottoms of the first and second trenches 151, 152. The sacrificial layer 155 may be formed using an atomic layer deposition (ALD) method or a chemical vapor deposition (CVD) method, as examples. In the presently preferred embodiment, the sacrificial layer 155 may be formed by the ALD method. When the sacrificial layer 155 is formed using the ALD method, the sacrificial layer 155 may be more conformally formed on the sidewalls and the bottoms of the first and second trenches 151 and 152.

In various embodiments, the sacrificial layer 155 may include at least one of a silicon oxide layer, a silicon nitride layer, a poly-crystalline silicon layer, and a metal layer. The metal layer may include titanium, titanium nitride, tantalum, and/or a tantalum nitride, examples.

Figure 8:
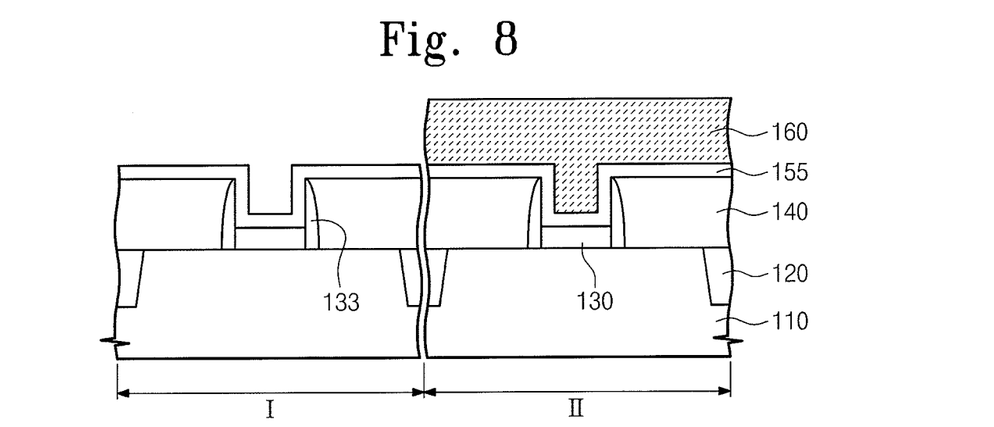
Figure 9A:
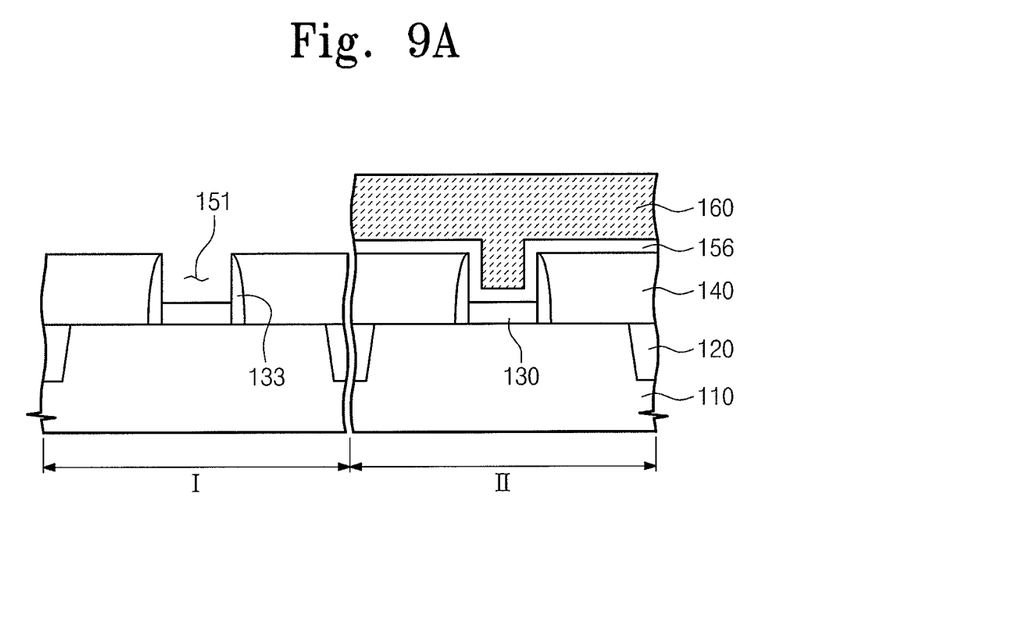
FIGS. 9A and 9B are cross-sectional views illustrating steps that may optionally be performed after the steps illustrated in FIGS. 1 through 8, in various embodiments of a method for manufacturing a semiconductor device, according to aspects of the inventive concept.

Referring to the embodiments of FIGS. 8 and 9A, a mask pattern 160 may be formed on the sacrificial layer 155 of the second region II to cover the second trench 152. As shown in FIG. 9A, the sacrificial layer 155 of the first region I may be removed using the mask pattern 160 as an etch mask thereby exposing the first gate dielectric layer 130 of the bottom of the first trench 151. For example, the sacrificial layer 155 of the first region I may be removed by a solution including at least one of hydrogen fluoride, phosphoric acid, sulfuric acid, hydrogen peroxide, ammonium hydroxide, hydrogen chloride, and amine. As a result of such etching, the sacrificial layer 155 is patterned to form a sacrificial pattern 156 in the second region II.

The mask pattern 160 may be formed of photoresist. In various embodiments, a portion of the mask pattern 160 may further extend into the first region I. Alternatively, in other embodiment, a width of the mask pattern 160 may be limited in order to cover only the second trench 152. In other words, in various embodiments, the width of the mask pattern 160 may be changed within a range which is able to expose the sacrificial layer 155 disposed on the sidewall and the bottom of the first trench 151 of the first region I.

Figure 10A:
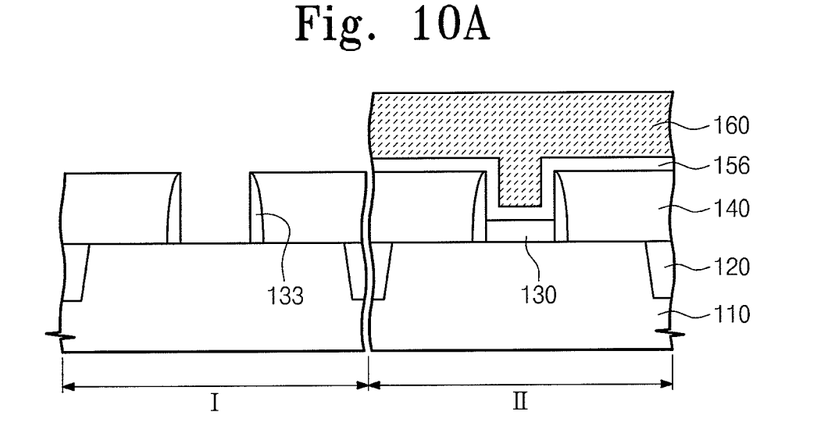
FIG. 10A is a cross-section view illustrating a step that may optionally be performed after the step illustrated in FIG. 9A, in various embodiments of a method for manufacturing a semiconductor device, according to aspects of the inventive concept.

Referring to the embodiment of FIG. 10A, the first gate dielectric layer 130 at the bottom of the first trench 151 is removed using the mask pattern 160 and the interlayer insulating layer 130 as etch masks to expose the substrate 110 in the first trench I.

The removal of the first gate dielectric layer 130 in the first trench 151 may be performed by a chemical oxide removal (COR) method using a HF gas and a $NH_3$ gas, or a chemical etching by plasma (CEP) method using $NH_3$ and $NF_3$ remote plasma, as examples. As a result, an exposed top surface of the interlayer insulating layer 140 may be partially etched.

Figure 11:
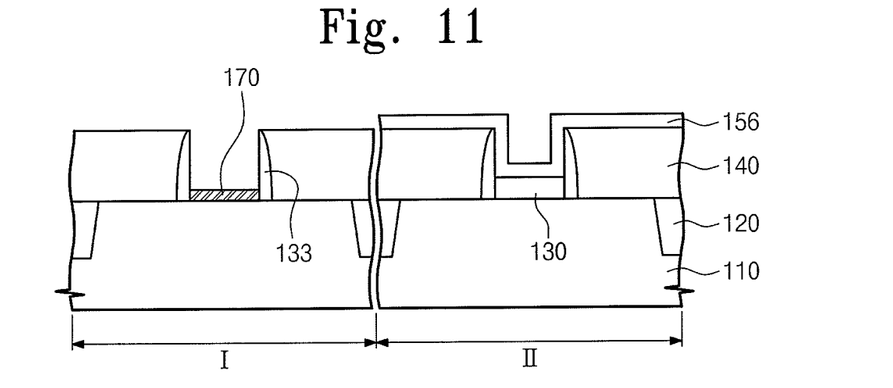
FIG. 11 is a cross-section view illustrating a step that may optionally be performed after the step illustrated in FIG. 10A, in various embodiments of a method for manufacturing a semiconductor device, according to aspects of the inventive concept.

Referring to the embodiment of FIG. 11, the mask pattern 160 in the second region II is removed to expose the sacrificial pattern 156. The mask pattern 160 may be removed using an organic stripper, sulfuric acid, or a high temperature SPM (sulfuric acid ($H_2SO_4$)+hydrogen peroxide ($H_2O_2$) mixture) process, as examples. Oxygen atoms included in a solution of the high temperature SPM process may react with silicon atoms of the substrate 110 exposed by the first trench 151 in the first region I. Thus, a chemical oxide layer 170 may be formed. Since the chemical oxide layer 170 may have a poor quality, it may be unsuitable to be used as a gate dielectric layer of a transistor. Thus, it is preferable to remove the chemical oxide layer 170.

Figure 12:
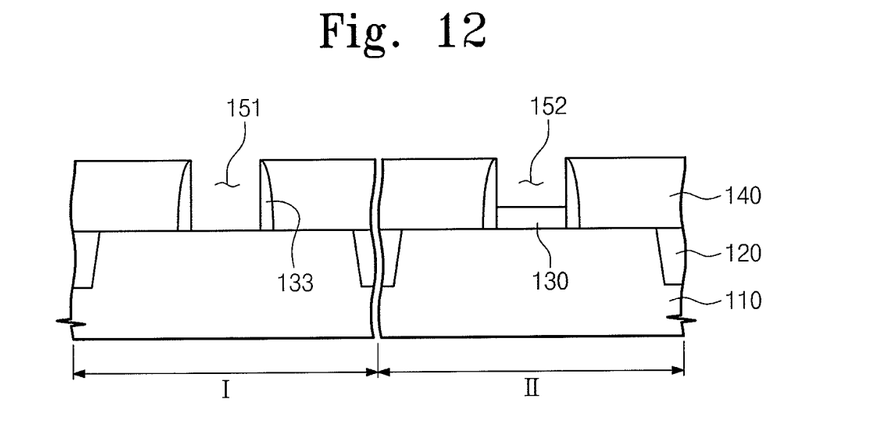
FIG. 12 is a cross-section view illustrating a step that may optionally be performed after the steps illustrated in FIGS. 10B or 11, in various embodiments of a method for manufacturing a semiconductor device, according to aspects of the inventive concept.

Referring to the embodiment of FIG. 12, the sacrificial pattern 156 in the second region II is removed to expose the first gate dielectric layer 130 of the bottom of the second trench 152 in the second region II. The chemical oxide layer 170 may be removed by the process used to remove the sacrificial pattern 156. Alternatively, the chemical oxide layer 170 may be removed by an additional process, before the sacrificial pattern 156 is removed.

The sacrificial pattern 156 may be removed by a solution including at least one of hydrogen fluoride, phosphoric acid, sulfuric acid, hydrogen peroxide, ammonium hydroxide, hydrogen chloride, and amine.

If the sacrificial layer 155 is formed of a poly-crystalline silicon layer, the sacrificial pattern 156 may be effectively removed by ammonium hydroxide and/or amine. The amine may include tetramethylammonium hydroxide (TMAH), tetraethylammonium hydroxide (TEAH), or tetrapropylammonium hydroxide (TPAH).

Figure 13:
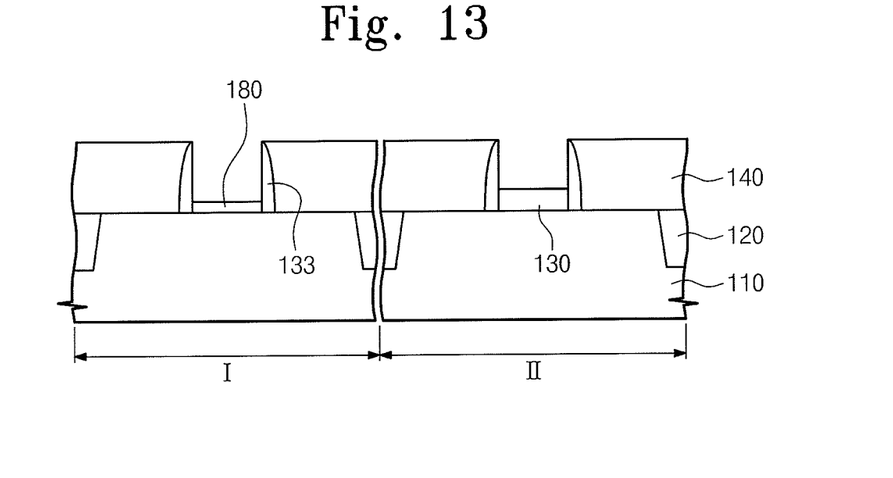
FIG. 13 is a cross-sectional view illustrating a step that may optionally be performed after the steps illustrated in FIGS. 10B and/or 12, in various embodiments of a method for manufacturing a semiconductor device, according to aspects of the inventive concept.

Referring to the embodiment of FIG. 13, a second gate dielectric layer 180 is formed on the bottom of the first trench 151 in the first region I. The second gate dielectric layer 180 is thinner than the first gate dielectric layer 130 formed in the second region II. That is, the second dielectric layer 180 can have a thickness T2 that is less than the thickness of the first gate dielectric layer T1. Thus, if T1 is about 38 Å, T2 may be less that about 38 Å. The second gate dielectric layer 180 may be formed using a chemical oxidation formation method, as an example.

Figure 14:
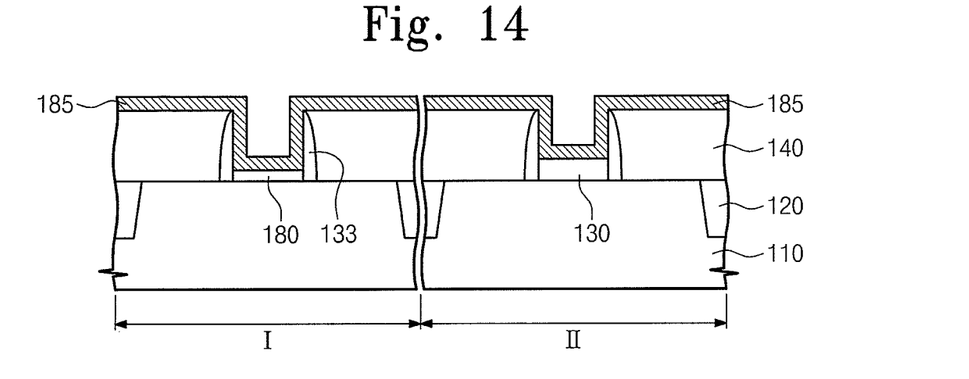
FIGS. 14 through 16 are cross-sectional views illustrating steps that may optionally be performed, after various steps from FIGS. 1 through 13, in various embodiments of a method for manufacturing a semiconductor device, according to aspects of the inventive concept.

Referring to the embodiment of FIG. 14, a high-k dielectric material 185 may be formed on the first and second gate dielectric layers 130 and 180. The high-k dielectric material 185 may include at least one of a hafnium oxide, a hafnium-silicon oxide, a lanthanum oxide, a zirconium oxide, a zirconium-silicon oxide, a tantalum oxide, a titanium oxide, a barium-strontium-titanium oxide, a barium-titanium oxide, a strontium-titanium oxide, a lithium oxide, an aluminum oxide, a lead-scandium-tantalum oxide, and a lead-zinc niobate.

Figure 15:
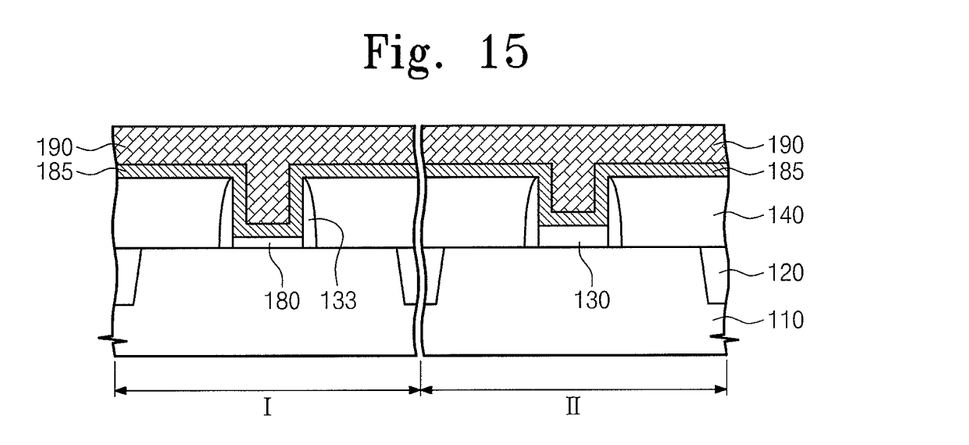

Referring to the embodiment of FIG. 15, a gate electrode layer 190 is formed on the high-k dielectric material 185. If the high-k dielectric material 185 is not formed, the gate electrode layer 190 may be formed on the second gate dielectric layer 180 at the bottom of the first trench 151, the first gate dielectric layer 130 at the bottom of the second trench 152, and the top surface of the interlayer insulating layer 140.

Figure 16:
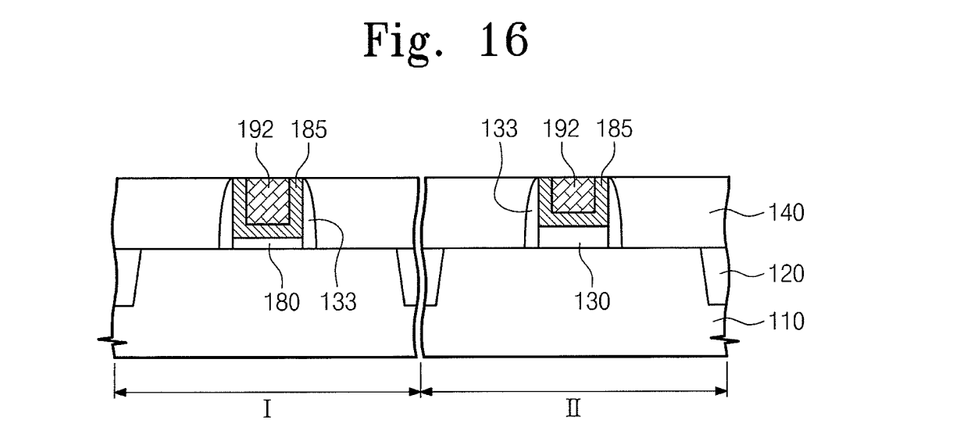

Referring to the embodiment of FIG. 16, the gate electrode layer 190 and the high-k dielectric material 185 are planarized until the interlayer insulating layer 140 is exposed. As a result, a gate electrode 192 is formed in each of the first and second trenches 151 and 152, respectively. The planarization process used on the gate electrode layer 190 may be performed using an etch-back process or a chemical mechanical polishing (CMP) process, as examples. The gate electrode layer 190 may include at least one of titanium, titanium nitride, tantalum, tantalum nitride, tungsten, copper, aluminum and any combination thereof.

Another embodiment method for manufacturing a semiconductor device according to aspects of the inventive concept will be described with reference to the embodiments of FIGS. 9A, 9B, 10B, 12, and 13. For the purposes of ease and convenience, differences between the present embodiment and the aforementioned embodiments will be mainly described hereinafter.

Referring to the embodiment of FIG. 9A again, the sacrificial layer 155 of the first region I is removed using the mask pattern 160 as an etch mask to form the sacrificial pattern 156 exposing the first gate dielectric layer 130 of the bottom of the first trench 151.

Figure 9B:
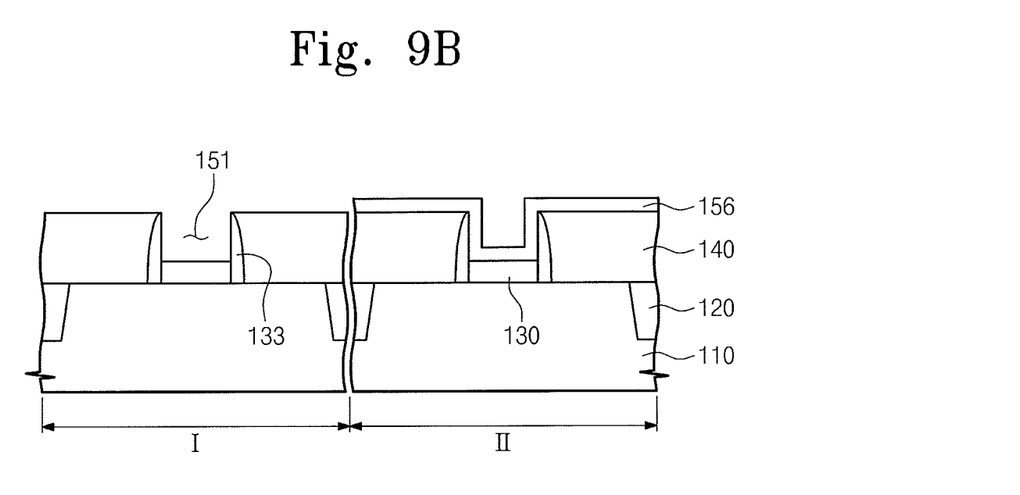
Figure 10B:
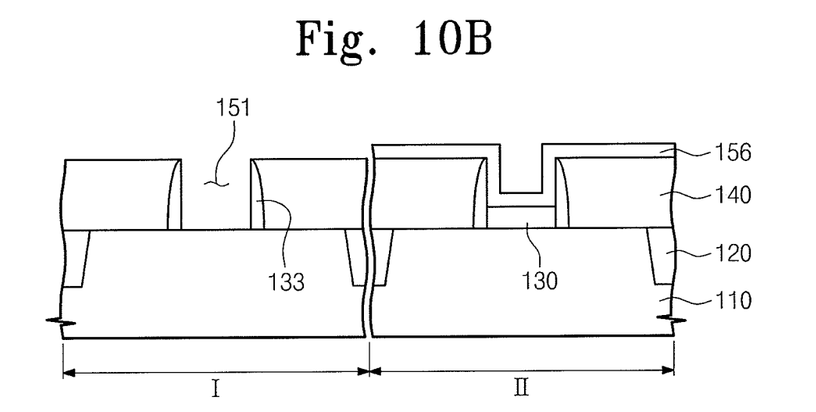
FIG. 10B is a cross-section view illustrating a step that may optionally be performed after the step illustrated in FIG. 9B, in various embodiments of a method for manufacturing a semiconductor device, according to aspects of the inventive concept.

Referring to the embodiments of FIGS. 9B and 10B, after the mask pattern 160 of FIG. 9A is removed, the exposed first gate dielectric layer 130 of the bottom of the first trench 151 of the first region I is removed using the sacrificial pattern 156 and the interlayer insulating layer 140 as etch masks to expose the substrate 110 at the bottom of the first trench 151.

Referring again to the embodiments of FIGS. 12 and 13, the sacrificial pattern 156 in FIG. 9B is removed and then the second gate dielectric layer 180, which is thinner than the first gate dielectric layer 130, is formed on the bottom of the first trench 151. Subsequent processes may be the same as described in the aforementioned some embodiments, such as those described with respect to FIGS. 14 through 16.

As described above, in various embodiments, if the mask pattern 160 is removed such that the substrate 110 at the bottom of the first trench 151 is exposed, the chemical oxide layer 170 may be formed on the exposed surface of the substrate 110. (e.g., see FIG. 11) However, according to the present embodiment, since the mask pattern 160 is removed such that the substrate 110 is not exposed, it is possible to prevent oxygen atoms in the solution removing the mask pattern 160 from reacting with silicon atoms the exposed substrate 110. As a result, formation of the chemical oxide layer 170 may be prevented.

Another embodiment of a method for manufacturing a semiconductor device according to aspects of the inventive concept will be described with reference to the embodiments of FIGS. 9A and 10C. For the purposes of ease and convenience, differences between the present embodiment and the aforementioned embodiments will be mainly described.

Figure 10C:
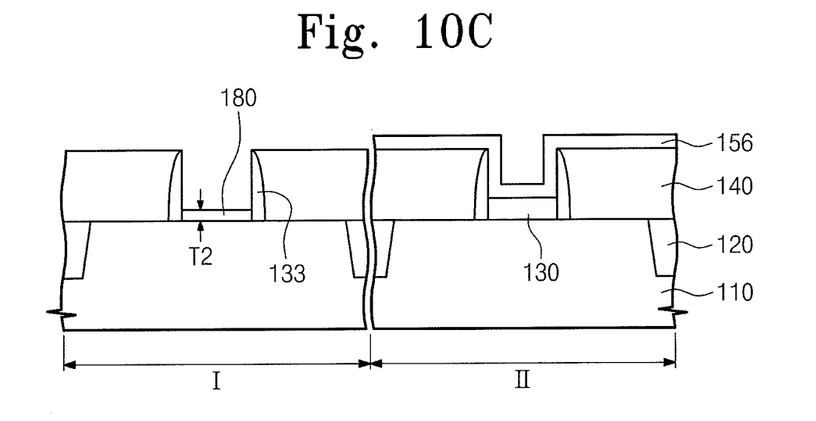
FIG. 10C is a cross-section view illustrating a step that may optionally be performed after the step illustrated in FIG. 9A, in various embodiments of a method for manufacturing a semiconductor device, according to aspects of the inventive concept.

Referring to FIGS. 9A and 10C, after the sacrificial pattern 156 exposing the first gate dielectric layer 130 under the first trench 151 is formed as illustrated in FIG. 9A, an upper portion of the first gate dielectric layer 130 under the first trench 151 is etched to form a second gate dielectric layer 180 that is thinner than the first gate dielectric layer 130 at the bottom of the second trench 152 in the second region II.

The process used for etching the upper portion of the first gate dielectric layer 130 in the first trench 151 may be a wet etching process using an etch solution including hydrogen fluoride or a dry etching process using hydrogen and/or chlorine, as examples. The process used for etching the upper portion of the first gate dielectric layer 130 in the first trench 151 may be performed wherein the mask pattern 160 exists as illustrated in FIG. 9A. Alternatively, after the mask pattern 160 is removed, the upper portion of the first gate dielectric layer 130 under the first trench 151 may be etched using the sacrificial pattern 156 and the interlayer insulating layer 140 as etch masks.

Another embodiment of a method for manufacturing a semiconductor device according to aspects of the inventive concept will be described with reference to the embodiments of FIGS. 10B and 13. For the purposes of ease and convenience, differences between the present embodiment and the aforementioned embodiment will be mainly described.

Referring to the embodiments of FIGS. 10B and 13, the substrate 110 under the first trench 110 is exposed and then the second gate dielectric layer 180 is formed wherein the sacrificial pattern 156 is not removed. The sacrificial pattern 156 may be removed simultaneously with formation of the second gate dielectric layer 180. For example, if the sacrificial pattern 156 is formed of a titanium nitride and the second gate dielectric layer 180 is formed using a solution including ammonium hydroxide and hydrogen peroxide or a solution including ozone, the sacrificial pattern 156 may be removed at the same time as the formation of the second gate dielectric layer 180. In this case, it is possible to reduce manufacturing cost of the semiconductor device by process simplification.

According to the embodiments described above, the gate dielectric layers having better quality may be formed when transistors including the gate dielectric layers having different thicknesses from each other are formed on the substrate 110 in first and second regions I and II using a gate last process.

In some embodiments, the solution used for removing the mask pattern 160 may not be in contact with the substrate. Thus, it is possible to prevent the formation of the chemical oxide layer 170 caused by the reaction between the oxygen atoms in the solution removing the mask pattern 160 and the silicon atoms of the exposed substrate.

According to embodiments of the inventive concept, it is possible to decrease or prevent deterioration of reliability of transistors including the gate dielectric layers having different thicknesses from each other in a high-voltage region and a low-voltage region.

While the inventive concept has been described with reference to example embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:

1. A method of manufacturing a semiconductor device, comprising:
   providing a substrate including a first region and a second region;
   forming a first gate dielectric layer having a first thickness on the substrate;
   forming an interlayer insulating layer on the substrate, the interlayer insulating layer including a first trench exposing the first gate dielectric layer of the first region and a second trench exposing the first gate dielectric layer of the second region;
   forming a sacrificial layer on the interlayer insulating layer and bottoms of the first and second trenches;
   forming a mask pattern covering the second trench of the second region on the sacrificial layer;
   removing the sacrificial layer in the first region using the mask pattern as an etch mask to form a sacrificial pattern exposing the first gate dielectric layer of the bottom of the first trench;
   removing the first gate dielectric layer of the bottom of the first trench to expose the substrate;
   removing the mask pattern;
   removing the sacrificial pattern;
   forming a second gate dielectric layer having a second thickness on the bottom of the first trench; and
   forming a gate electrode on each of the first gate dielectric layer and the second gate dielectric layer.

2. The method of claim 1, wherein forming the interlayer insulating layer including the first trench and the second trench comprises:
   forming a first dummy gate pattern on the first gate dielectric layer of the first region;
   forming a second dummy gate pattern on the first gate dielectric layer of the second region;
   forming the interlayer insulating layer exposing top surfaces of the first dummy gate pattern and the second dummy gate pattern; and
   removing the first dummy gate pattern and the second dummy gate pattern.

3. The method of claim 2, further comprising:
   forming a spacer on sidewalls of each of the first and second dummy gate patterns.

4. The method of claim 1, further comprising:
   forming a high-k dielectric material between each of the gate electrodes and each of the first and second gate dielectric layers.

5. The method of claim 1, wherein the sacrificial layer includes at least one of a silicon oxide layer, a silicon nitride layer, a poly-crystalline silicon layer, and a metal layer.

6. The method of claim 1, wherein the sacrificial layer is formed by an atomic layer deposition (ALD) method.

7. The method of claim 1, wherein removing the sacrificial layer in the first region using the mask pattern as the etch mask is performed using a solution including at least one of hydrogen fluoride, phosphoric acid, sulfuric acid, hydrogen peroxide, ammonium hydroxide, hydrogen chloride, and amine.

8. The method of claim 1, wherein removing the first gate dielectric layer of the bottom of the first trench to expose the substrate is performed by a chemical oxide removal (COR) method using a HF gas and a $NH_3$ gas, or a chemical etching by plasma (CEP) method using $NH_3$ and $NF_3$ remote plasma.

9. The method of claim 1, including forming the mask pattern of a photoresist.

10. The method of claim 9, wherein removing the mask pattern is performed using an organic stripper, sulfuric acid, or a mixture solution of sulfuric acid and hydrogen peroxide.

11. The method of claim 10, including forming a chemical oxide layer on the substrate exposed by the first trench when the mask pattern is removed; and removing the chemical oxide layer simultaneously with the sacrificial pattern when the sacrificial pattern is removed.

12. The method of claim 1, including forming the first gate dielectric layer by a dry oxidation method or a radical oxidation method.

13. The method of claim 1, including forming the second gate dielectric layer by a chemical oxidation method.

14. The method of claim 1, wherein the first thickness of the first gate dielectric layer is greater than the second thickness of the second gate dielectric layer.

15. The method of claim 1, wherein the gate electrode includes at least one of titanium, titanium nitride, tantalum, tantalum nitride, tungsten, copper, aluminum and any combination thereof.

16. The method of claim 1, wherein removing the sacrificial pattern is performed simultaneously with the formation of the second gate dielectric layer having the second thickness on the bottom of the first trench.

17. The method of claim 16, including forming the sacrificial layer of titanium nitride, wherein forming the second gate dielectric layer is performed using a solution including ammonium hydroxide and hydrogen peroxide or a solution including ozone.

18. A method for manufacturing a semiconductor device, comprising:

providing a substrate including a first region and a second region;

forming a first gate dielectric layer having a first thickness on the substrate;

forming an interlayer insulating layer on the substrate, the interlayer insulating layer including a first trench exposing the first gate dielectric layer of the first region and a second trench exposing the first gate dielectric layer of the second region;

forming a sacrificial layer on the interlayer insulating layer and bottoms of the first and second trenches;

forming a mask pattern covering the second trench of the second region on the sacrificial layer;

removing the sacrificial layer in the first region using the mask pattern as an etch mask to form a sacrificial pattern covering the second trench;

removing the mask pattern;

removing the first gate dielectric layer of the bottom of the first trench using the sacrificial pattern as an etch mask to expose the substrate;

forming a second gate dielectric layer having a second thickness on the bottom of the first trench; and forming a gate electrode on each of the first gate dielectric layer and the second gate dielectric layer.

19. The method of claim 18, further comprising:

forming a high-k dielectric material between each of the gate electrodes and each of the first and second gate dielectric layers.

20. A method for manufacturing a semiconductor device, comprising:

providing a substrate including a first region and a second region;

forming a first gate dielectric layer having a first thickness on the substrate;

forming an interlayer insulating layer on the substrate, the interlayer insulating layer including a first trench exposing the first gate dielectric layer of the first region and a second trench exposing the first gate dielectric layer of the second region;

forming a sacrificial layer on the interlayer insulating layer and bottoms of the first and second trenches;

forming a mask pattern covering the second trench of the second region on the sacrificial layer;

removing the sacrificial layer in the first region using the mask pattern as an etch mask to form a sacrificial pattern;

removing an upper portion of the first gate dielectric layer of the bottom of the first trench to form a second gate dielectric layer having a second thickness smaller than the first thickness; and forming a gate electrode on each of the first gate dielectric layer and the second gate dielectric layer.

21. A method for manufacturing a semiconductor device having a dual gate dielectric layer, comprising:

providing a substrate including first and second regions;

forming a first gate dielectric layer having a first thickness on the substrate;

forming an interlayer insulating layer including first and second trenches exposing the first gate dielectric layer in the first and second regions;

forming a sacrificial layer on the interlayer insulating layer and bottoms of the first and second trenches;

forming a sacrificial pattern exposing the first gate dielectric layer of the bottom of the first trench;

forming a second gate dielectric layer having a second thickness on the bottom of the first trench; removing the sacrificial pattern; and forming a gate electrode on each of the first and second gate dielectric layers.

22. The method of claim 21, wherein the second dielectric layer is thinner than the first dielectric layer.

23. The method of claim 21, further comprising:

forming a high-k dielectric material between each of the gate electrodes and each of the first and second gate dielectric layers.

* * * * *